US008384597B2

(12) United States Patent
Manholm et al.

(10) Patent No.: US 8,384,597 B2
(45) Date of Patent: Feb. 26, 2013

(54) TILT-DEPENDENT BEAM-SHAPE SYSTEM

(75) Inventors: Lars Manholm, Göteborg (SE); Mats H Andersson, Göteborg (SE); Martin Johansson, Mōlndal (SE); Sven Oscar Petersson, Sāvedalen (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 657 days.

(21) Appl. No.: 12/444,482

(22) PCT Filed: Oct. 16, 2006

(86) PCT No.: PCT/SE2006/001170
§ 371 (c)(1),
(2), (4) Date: Jan. 12, 2010

(87) PCT Pub. No.: WO2008/048149
PCT Pub. Date: Apr. 24, 2008

(65) Prior Publication Data
US 2010/0134359 A1 Jun. 3, 2010

(51) Int. Cl.
*H01L 35/00* (2006.01)

(52) U.S. Cl. ..................... 343/700 R; 343/824; 343/777

(58) Field of Classification Search .............. 343/700 R, 343/824, 777, 756–758, 893; 342/383, 372, 342/81, 368, 373, 378, 371
See application file for complete search history.

(56) References Cited

U.S. PATENT DOCUMENTS

| | | | | |
|---|---|---|---|---|
| 3,763,445 | A | 10/1973 | Hannaford et al. | |
| 4,178,581 | A | 12/1979 | Willey, Sr. | |
| 4,249,181 | A | 2/1981 | Lee | |
| 4,359,742 | A | 11/1982 | Smith | |
| 4,642,645 | A | 2/1987 | Haupt | |
| 5,798,675 | A | 8/1998 | Drach | |
| 5,801,600 | A | 9/1998 | Butland et al. | |
| 5,886,591 | A * | 3/1999 | Jean et al. | 333/118 |
| 5,949,303 | A | 9/1999 | Arvidsson et al. | |

(Continued)

FOREIGN PATENT DOCUMENTS

| | | |
|---|---|---|
| DE | 24 58 477 A1 | 7/1976 |
| EP | 1 204 163 A2 | 5/2002 |

(Continued)

OTHER PUBLICATIONS

International Search Report for PCT/SE2006/001170, mailed May 22, 2007.

(Continued)

*Primary Examiner* — Vibol Tan
(74) *Attorney, Agent, or Firm* — Nixon & Vanderhye, P.C.

(57) ABSTRACT

The present invention relates to a system for changing the radiation pattern shape of an antenna array during electrical tilting. The antenna array has multiple antenna elements, and the system comprises a phase-shifting device provided with a primary port configured to receive a transmit signal, and multiple secondary ports configured to provide phase shifted output signals to each antenna element. The system further comprises a phase-taper device that changes phase taper over the antenna elements, and thus the beam shape, with tilt angle θ. The invention is adapted for use in down-link as well as up-link within a wireless communication system.

22 Claims, 6 Drawing Sheets

U.S. PATENT DOCUMENTS

| | | | | |
|---|---|---|---|---|
| 5,969,689 | A | 10/1999 | Martek et al. | |
| 6,151,310 | A | 11/2000 | Dent | |
| 6,268,828 | B1 | 7/2001 | Martek | |
| 6,311,075 | B1 | 10/2001 | Bevan et al. | |
| 6,690,326 | B2 * | 2/2004 | Nemit et al. | 342/383 |
| 6,831,602 | B2 | 12/2004 | McKinzie, III et al. | |
| 6,864,837 | B2 * | 3/2005 | Runyon et al. | 342/372 |
| 7,026,889 | B2 | 4/2006 | Sledkov | |
| 7,420,507 | B2 * | 9/2008 | Thomas et al. | 342/368 |
| 2003/0003959 | A1 | 1/2003 | Tsui et al. | |
| 2003/0164744 | A1 | 9/2003 | Love | |
| 2004/0246175 | A1 | 12/2004 | Thomas | |
| 2004/0263410 | A1 | 12/2004 | Teillet et al. | |
| 2009/0322610 | A1 * | 12/2009 | Hants et al. | 342/372 |

FOREIGN PATENT DOCUMENTS

| | | | |
|---|---|---|---|
| EP | 1 215 750 | A2 | 6/2002 |
| JP | 10-065439 | A | 3/1998 |
| JP | 2004-229220 | A | 8/2004 |
| WO | 98/11626 | A1 | 3/1998 |
| WO | 01/03233 | A1 | 1/2001 |
| WO | 02/05383 | A1 | 1/2002 |
| WO | 02/15326 | A3 | 2/2002 |

OTHER PUBLICATIONS

European Search Report, dated Nov. 5, 2010 in corresponding EP application 09156292.6.

Zornoza et al, "Folded Multilayer Microstrip Reflectarray with Shaped Pattern", IEEE Transactions on Antennas and Propagation, vol. 54, 2006, pp. 510-518.

Barba et al, "Elevation Radiation Pattern Shaping and Control in Broadband Base Station Antenna Arrays", Applied Electromagnetics and Communications, 2005, 18$^{th}$ International Conference on ICECom 2005, pp. 1-3.

Forster et al, "A Conical Beam Ship Array Antenna with Infinitely Variable Control of Elevation Angle", Institute für Flygfunk und Microwellen, 1973.

* cited by examiner

TILT-DEPENDENT BEAM-SHAPE SYSTEM

This application is the U.S. national phase of International Application No. PCT/SE2006/001170, filed 16 Oct. 2006, the entire contents of which is hereby incorporated by reference.

TECHNICAL FIELD

The technology disclosed herein relates to a system for adapting the beam-shape of an antenna in a wireless communication network.

BACKGROUND

Variable beam tilt is an important tool for optimizing radio access networks for cellular telephony and data communications. By varying the main beam pointing direction of the base station antenna, both interference environment and cell coverage area can be controlled.

Variable electrical beam tilt is conventionally performed by adding a variable linear phase shift to the excitation of the antenna elements, or groups of elements, by means of some phase-shifting device. For cost reasons, this phase-shifting device should be as simple and contain as few components as possible. It is therefore often realized using some kinds of variable delay lines. In the description, the terms "linear" and "non-linear" should be understood to refer to relative phase over multiple secondary ports of a multiport phase shifting network, and not the time or phase behaviour of a port in itself.

Conventional multi-port phase shifters, with one primary port and a number N (N>1) secondary ports, are implemented with linear progressive variable phase taper over the secondary ports. In addition to the linear progressive phase taper, fixed amplitude and phase tapers are often used as a means for generating a tapered nominal secondary port distribution.

FIGS. 1*a* and 1*b* illustrate a conventional phase shifter 10, with one primary port 11, and the phase shifter generates in down-link linear progressive phase shifts over four secondary ports $\mathbf{12}_1$-$\mathbf{12}_4$. A variable-angle "delay board" 13 has multiple trombone lines 14, one for each secondary port $\mathbf{12}_1$-$\mathbf{12}_4$. The trombones lines 14 are arranged at linearly progressive radii. By a proper choice of junction configurations, line lengths, and line impedance values, the nominal phase and amplitude taper of the phase shifter can be controlled, for example to achieve uniform phase over the secondary ports as indicated by "0" in FIG. 1*a*. By changing the delay line lengths (i.e. the length of the trombone lines 14), in this case by rotation of the delay board 13 relative to a fixed board 15, the secondary ports $\mathbf{12}_1$-$\mathbf{12}_4$ experience linear progressive phase shifts as indicated in FIG. 1*b*. In up-link, the secondary ports $\mathbf{12}_1$-$\mathbf{12}_4$ receive signals from an antenna (not shown) which are combined within the phase shifter to a common receive signal at the primary port 11.

The use of non-linear phase-shifting devices for controlling electrical down tilt has been contemplated, such as mentioned in U.S. Pat. No. 5,798,675, by Drach, U.S. Pat. No. 5,801,600, by Butland et al.

A system for tilt-dependent beam shaping using conventional linear phase shifters is disclosed in JP 2004 229220. The system has different beam width depending on the tilt angle, but this is achieved by a tilt angle control section (41) in combination with a vertical beam width control section (42) in the base station controller (4), see FIG. 6 in JP 2004 229220.

Traditionally, base station antennas have had a variable beam tilt range of approximately one beamwidth. This together with the fact that most mobile connections today are circuit switched voice with a fixed requirement on bit-rates, has not triggered any interest in improving the Signal-to-interference+noise ratio (SINR) close to the antenna. Normally it is good enough.

For particular cell configurations, e.g. highly placed antennas in combination with small cells, the need for using antennas with large beam tilt is greater. For antennas with conventional narrow elevation beam radiation patterns, the large beam tilt causes users close to the base station to experience a lower path gain than users close to the cell border, since the difference in path loss for the near and far users is smaller than the difference in directive antenna gain. For packet-based data communication this is not optimal usage of the available power. Therefore, for antennas with large beam tilt, some degree of radiation pattern null-fill below the main beam, or even some cosec-like beam-shaping is desirable.

In large cells, on the other hand, when no or small beam tilt is employed, the antenna pattern should be optimized for maximum peak gain. The path gain for the users at the cell border will anyway be smaller than for users closer to the base station because the path loss varies rapidly with vertical observation angle in the case of large cells and observation angles close to the horizon.

SUMMARY

The technology disclosed herein provides a system that allows a radiation pattern of an antenna to be optimized both for high maximum gain at small tilt angles, and high degree of null filling below the main beam at large tilt angles.

The technology disclosed herein provides a system for changing the beam shape of an antenna, preferably having multiple antenna elements arranged in an array, in dependency of a tilt angle. Electric tilting is achieved by including a phase-shifting device that will provide phase shifts over secondary ports from the phase-shifting device. A phase-taper device provides changed phase taper over the antenna elements with tilt angle.

An advantage with the technology disclosed herein is that a single antenna may be used in an adaptive system, to fulfil the need for increasing the quality of a communication link and thus increase the bit rate associated with one or more simultaneous users, by maintaining an optimal antenna pattern, which depends on the distance to the base station.

Further objects and advantages will become apparent for a skilled person from the detailed description.

DETAILED DESCRIPTION

A base station, including an antenna with multiple antenna elements, is arranged within a cell, where the characteristics of the antenna determine the size of the cell and the cell coverage area all else being equal. To accomplish the same signal strength in the entire cell, independent of the distance to the base station, the antenna gain G(θ) divided by the path loss L(θ) should be constant in the cell, as a function of observation angle θ:

$$\frac{G(\theta)}{L(\theta)} = C = const.$$

Figure 7A:
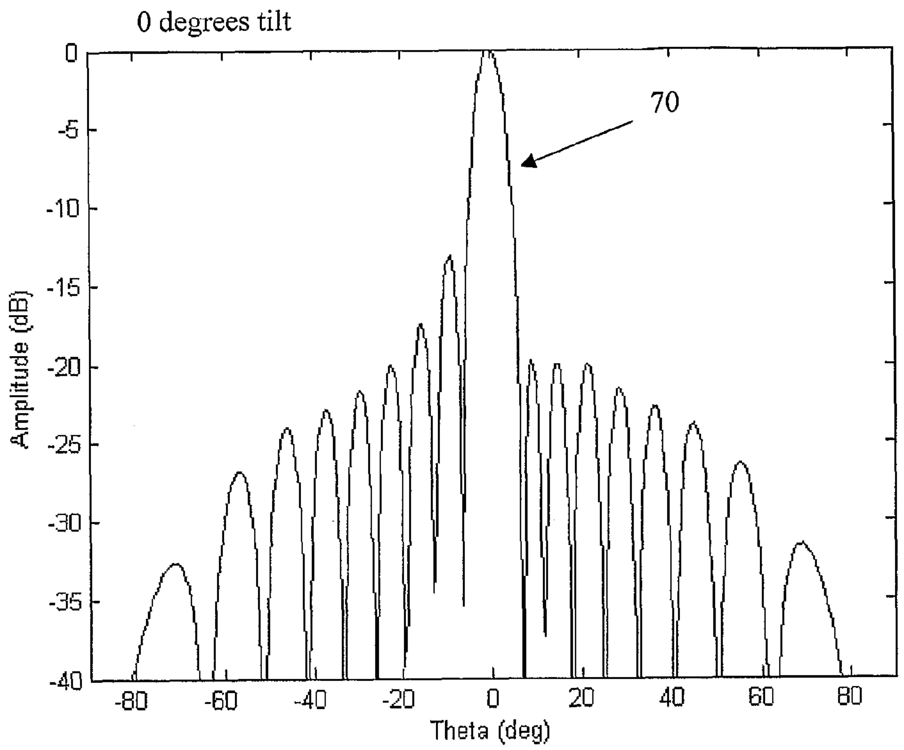
FIGS. 7*a*-7*d* show elevation radiation patterns utilizing the technology disclosed herein.
Figure 7B:
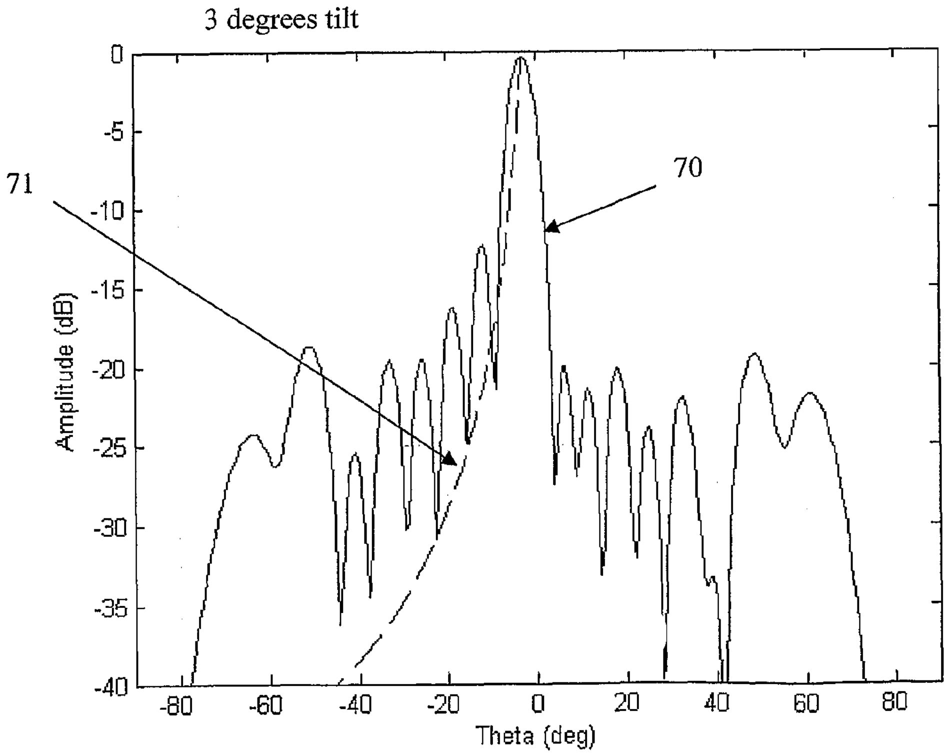
Figure 7C:
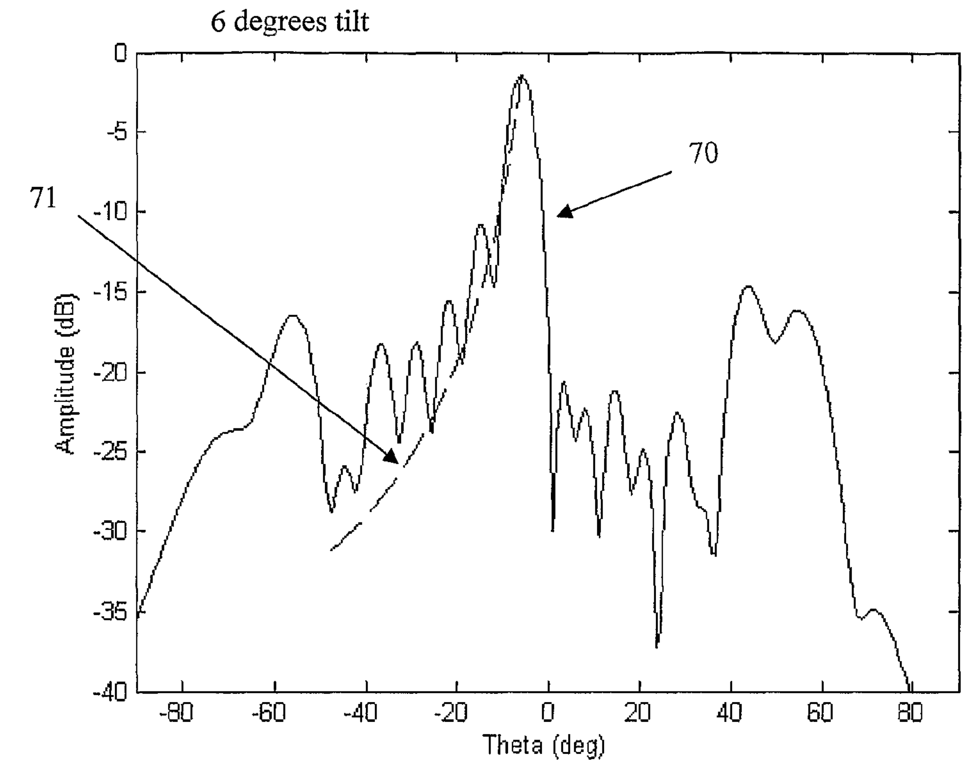
Figure 7D:
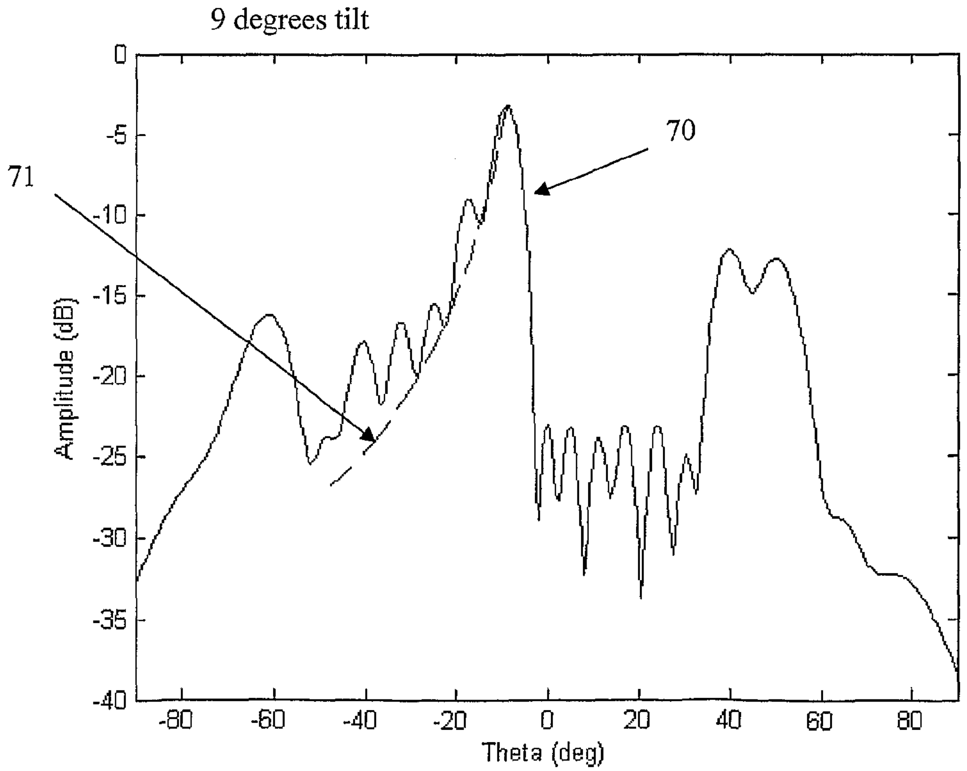

However, the constant C changes with cell configuration, i.e. antenna installation height and cell size, which in turn means that the optimal antenna radiation pattern changes with beam tilt angle, as illustrated in FIGS. 7*b*-7*d*, lines 71. The tilt dependent radiation pattern can be accomplished by changing the phase taper over the antenna with tilt-angle, e.g. by providing a non-linear phase shifter as described in connection with FIGS. 2*a*, 2*b*, 3*b* and 4. The non-linear phase shifter facilitates different phase tapers for different beam tilt angles, and thus will provide tilt-dependent beam shape of the antenna.

The terms "phase shift" and "time delay" are used interchangeably in the following description and it should be understood that these terms refer to equivalent properties in the present context, except if otherwise noted.

An essential part of the technology disclosed herein is to provide non-linear phase taper over the secondary ports of a phase shifter network. A method for achieving this is to use a multi-secondary port true time delay network in which the relative delay line lengths are, in general, non-linearly progressive. A true time delay network generates frequency-dependent phase shifts, a property which makes it particularly suitable for antenna applications, such as beam-steering.

Figure 1A:
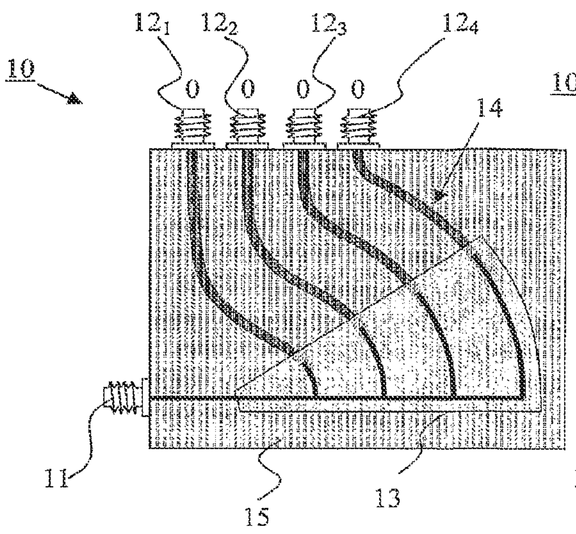
Fig. 1a Prior Art
FIGS. 1*a* and 1*b* show a linear phase shifter.
Figure 1B:
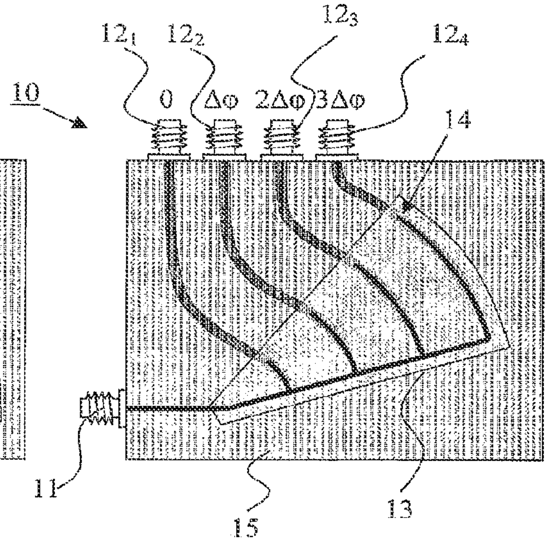
Fig. 1b Prior Art
Figure 2A:
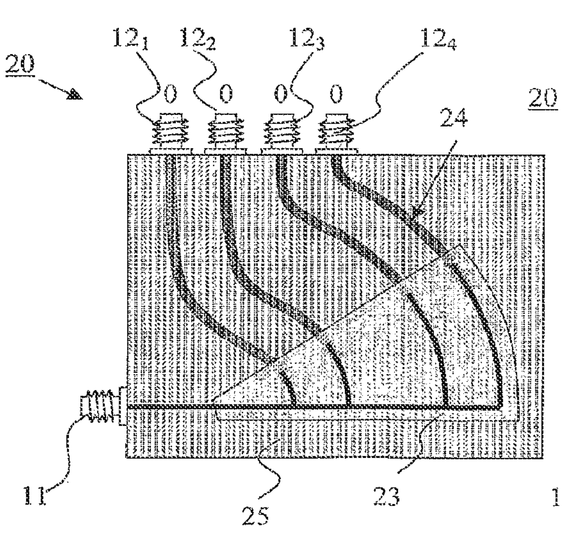
FIGS. 2*a* and 2*b* show a first embodiment of a non-linear phase shifter.
Figure 2B:
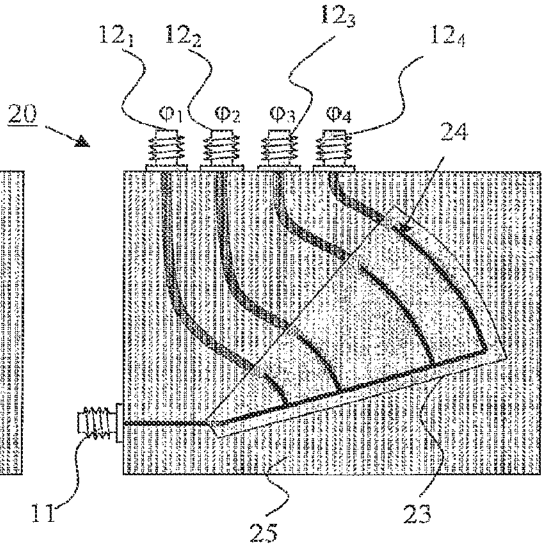

The principle idea of a first embodiment of a non-linear phase shifter 20, in down-link, is illustrated in FIGS. 2*a* and 2*b* using a true time delay network, similar to the one illustrated in FIGS. 1*a* and 1*b*. The key property of the delay network (and the method as such) is to provide non-linear relative time delays over the secondary ports, by arranging trombone lines 24 (in this particular embodiment) in a non-periodic fashion on a delay board 23. By a proper choice of junction configurations, line lengths, and line impedance values, the nominal phase and amplitude taper of the true time delay network with non-linear delay dependence can be controlled, for example to achieve uniform phase over the secondary ports as indicated by "0" at the secondary ports 12$_1$-12$_4$ in FIG. 2*a*. In contrast with the true time delay network in FIG. 1, changes in the delay line lengths by rotation of the delay board relative to a fixed board 25 produces non-linear progressive time delays (and, hence, phase shifts) over the secondary ports 12$_1$-12$_4$, as indicated by "$\phi_1$", "$\phi_2$", "$\phi_3$", and "$\phi_4$" in FIG. 2*b*. In up-link, the secondary ports 12$_1$-12$_4$ of the phase shifter 20 receive signals from an antenna (not shown) which are non-linearly time-delayed and combined within the phase shifter to a common receive signal at the primary port 11.

Figure 3A:
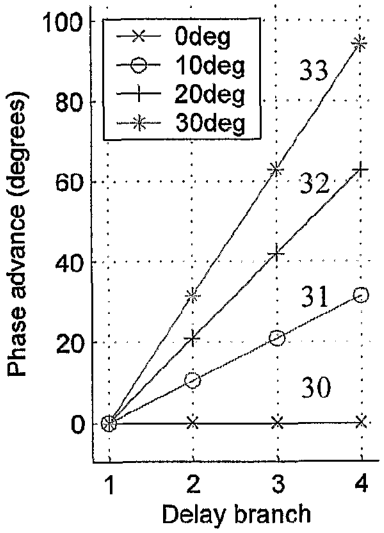
FIGS. 3*a* and 3*b* show diagrams illustrating phase shifts from the linear and non-linear phase shifters.
Figure 3B:
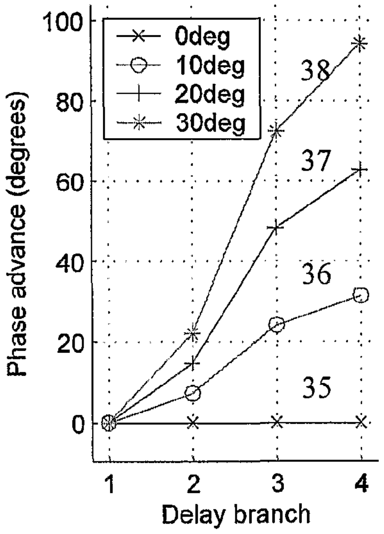

As a non-limiting example, the phase-shifts from a linear and a non-linear true time delay network in down-link are compared in FIGS. 3*a* and 3*b* for different rotations (see legend) of the delay board 13 and 23, respectively. In FIG. 3*a*, the phase advance (relative phase) over the secondary ports 12$_1$-12$_4$ is linear with delay board 13 rotation, which manifests itself as straight lines 30, 31, 32 and 33 for a given board rotation. This means that for any given delay board rotation, the relative phase values (between secondary port n and port 1) are $$\Delta\phi_n=(n-1)\Delta\phi=(n-1)k\alpha,$$

where n is the secondary port number, α is the board rotation angle, and k is a constant that depends on implementation aspects, for example wave number of transmission lines and radial separation of the trombones 14.

The non-linear phase advance (relative phase) over the secondary ports 12$_1$-12$_4$ of a non-linear true time delay network is illustrated in FIG. 3*b*. In FIG. 3*b*, the phase advance (relative phase) over the secondary ports 12$_1$-12$_4$ is non-linear when rotating the delay board 23, which manifests itself as one straight line 35 for 0° rotation and three non-straight lines 36, 37 and 38 for a given board rotation ≠0°. Thus, the relative phase values are not identical, i.e., $$\phi_n-\phi_{n-1}\neq\phi_{n+1}-\phi_n,\text{ for at least one n, } n\in\{2,N-1\}$$

wherein N is the number of delay branches. In FIG. 3*b*, the phase of delay branch 3 varies faster than twice that of branch 2 when the board angle changes.

Figure 4:
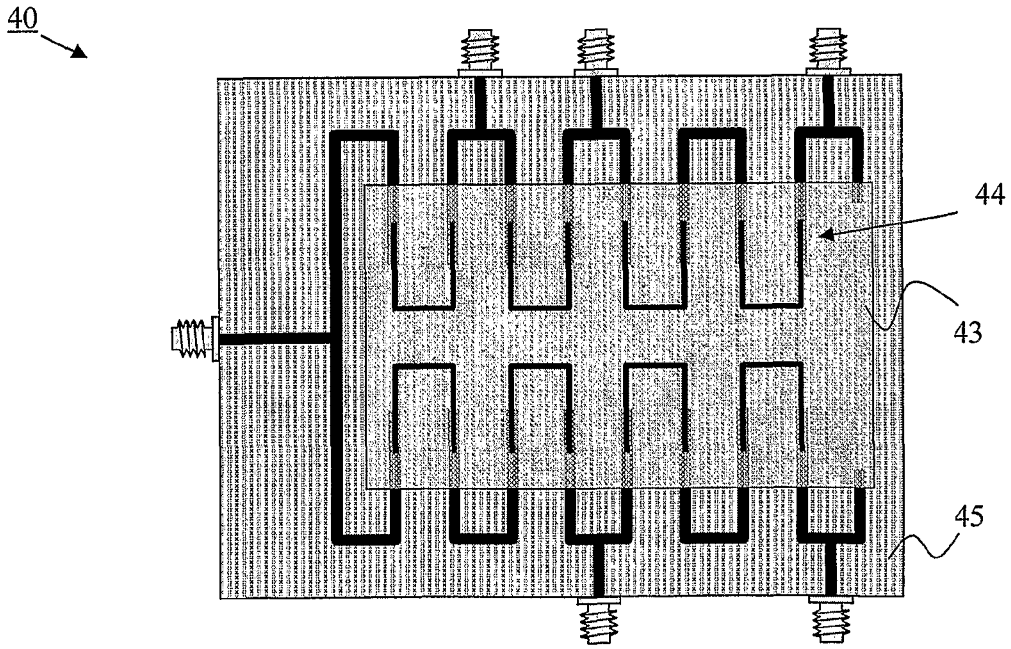
FIG. 4 shows a second embodiment of a non-linear phase shifter.

FIG. 4 shows a second embodiment of a non-linear phase shifter 40. This delay line network is based on translation (rather than rotation) of the delay board 43 relative a fixed board 45. The delay network trombone lines 44 are shown with equal lengths, but they could also have different lengths (both the lines on the delay board 43 and the lines on the fixed board 45).

Figure 5:
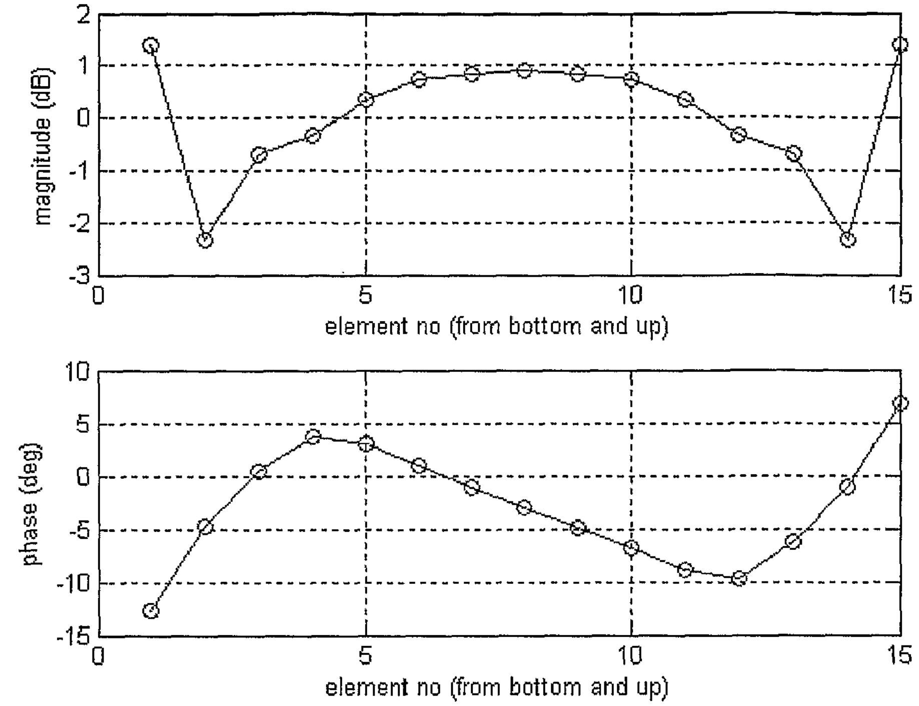
FIG. 5 shows antenna element excitation at 0° beam tilt.

FIG. 5 shows an element excitation of a 15 element linear antenna array, optimized for maximum gain and a suppression of the upper sidelobes to −20 dB. This element excitation produces the radiation pattern in FIG. 7*a*, i.e. 0° beam tilt. In prior art techniques, linearly progressive phase is added to the phase taper shown in FIG. 5 to achieve different tilt angles, $\theta_{tilt}$.

Figure 6:
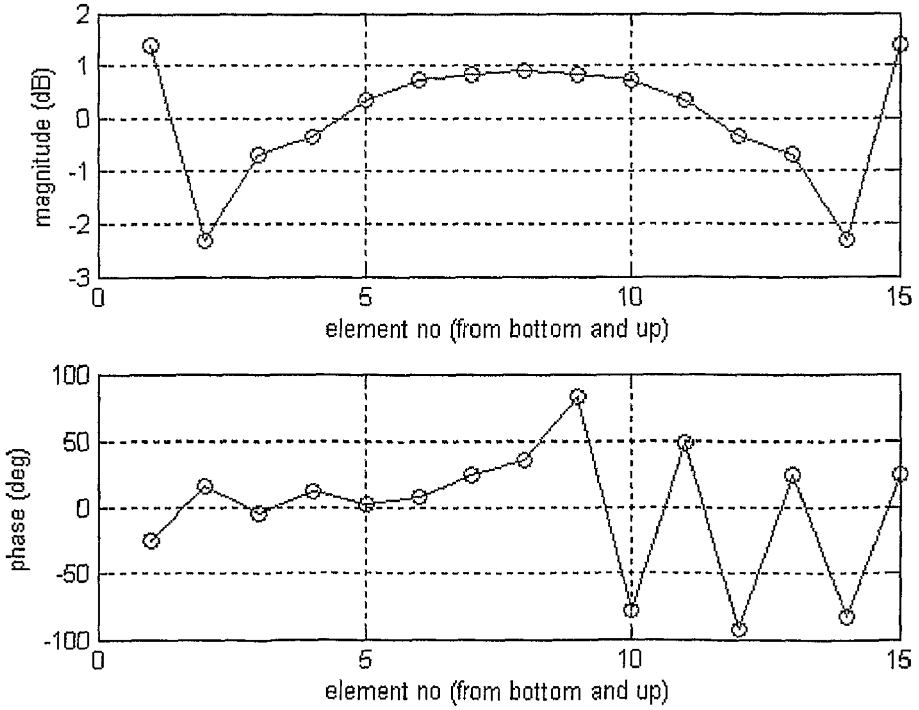
FIG. 6 shows antenna element excitation at 9° beam tilt.

FIG. 6 shows the element excitation for 9.degree. beam tilt, where the amplitude taper is the same as for 0.degree. beam tilt, but the phase taper has been optimized for null-filling, in accordance with the technology disclosed herein. This excitation produces the radiation pattern with 9° beam tilt in FIG. 7*d*.

For beam tilt angles between 0° and 9°, the phase excitation is found by a linear interpolation of the phase excitations at 0° and 9°. Some of these radiation patterns 70 are shown in FIGS. 7*b* and 7*c*, with the beam tilt changing 3° for each subplot. For comparison, the relative path loss 71, normalized at beam peak, is shown in the same plots. The relative path loss changes with beam tilt angle $\theta_{tilt}$.

The technology disclosed herein is not limited to the example with constant cell illumination described above, but is applicable in all cases where it is desirable, for one reason or another, to have a radiation pattern that changes with beam tilt angle. Furthermore, the technology disclosed herein is not limited to linear antenna arrays, but may also be implemented in a base station having a non-linear antenna array.

The technology disclosed herein allows the antenna pattern to be optimized both for high maximum gain at small tilt angles, and for good coverage (high degree of null filling) close to the antenna at large tilt angles $\theta_{tilt}$.

Figure 8:
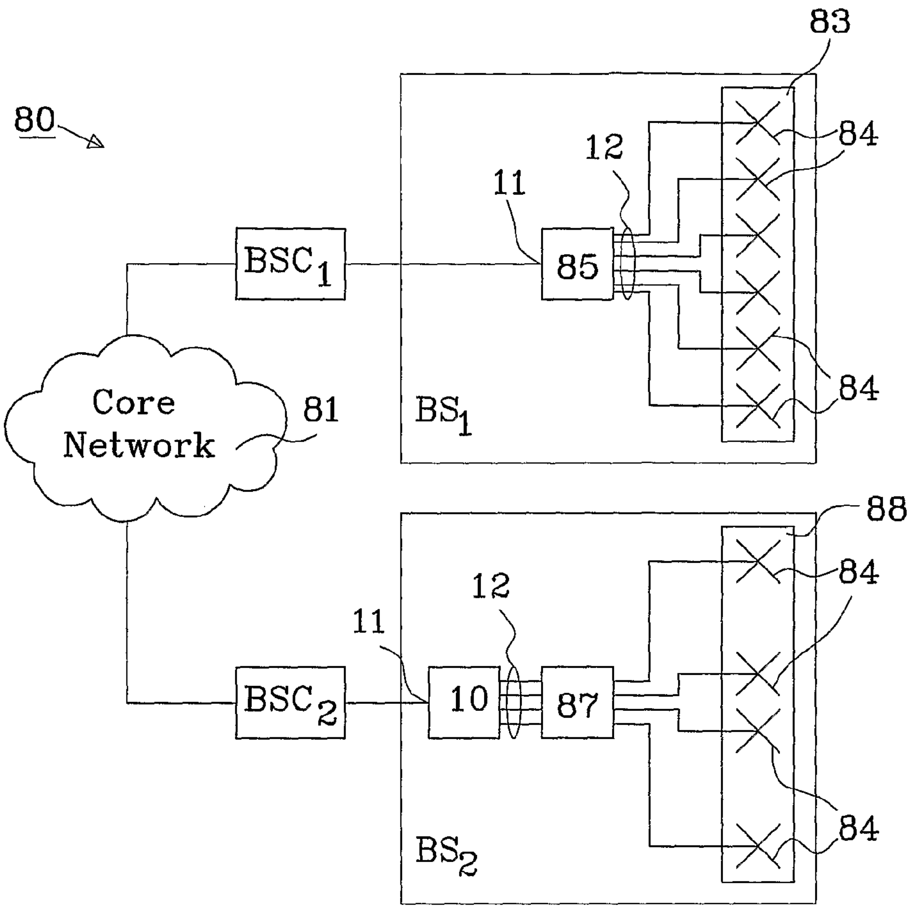
FIG. 8 shows a wireless telecommunication network having base stations including the technology disclosed herein.

FIG. 8 shows a wireless telecommunication system 80, exemplified using GSM standard, including a first base station $BS_1$. The first base station $BS_1$ is connected via a first base station controller $BSC_1$ to a core network 81 of the telecommunication system 80. A uniform linear antenna array 83 comprises in this embodiment six antenna elements 84. Secondary ports 12 of a non-linear phase shifter 85 is connected to each antenna element 84 of the uniform linear antenna array 83, and a primary port 11 of the phase shifter 85 is connected to the first base station $BS_1$. The first base station controller $BSC_1$ controls the variable beam tilt by changing the position of a non-linear delay board, as previously described in connection with FIGS. 2*a*, 2*b* and 4, and thereby altering the beam shape of a beam from the uniform linear antenna array 83.

The telecommunication system 80 also includes a second base station $BS_2$. The second base station $BS_2$ is connected via a second base station controller $BSC_2$ to the core network 81. A non-uniform linear antenna array 88 comprises in this embodiment four antenna elements 84, not necessarily cross polarized as illustrated. Secondary ports 12 of a linear phase shifter 10 (prior art) are connected, via a phase-taper device 87 that changes the phase taper over the antenna elements with tilt angle $\theta_{tilt}$, to each antenna elements 84 of the non-linear antenna array 88. A primary port 11 of the phase shifter 10 is connected to the second base station $BS_2$. The second base station controller $BSC_2$ controls the variable beam tilt by changing the position of a linear delay board, as previously described in connection with FIGS. 1*a* and 1*b*, and thereby altering the beam shape of a beam from the non-uniform linear antenna array 88.

It should be noted that the antenna array may have uniformly, or non-uniformly, arranged antenna elements 84, and cross polarized antenna elements are only shown as a non-limiting example and other types of antenna elements may naturally be used without deviating from the scope of the invention. Furthermore, antenna elements operating in different frequency bands may be interleaved without departing from the scope of the claims.

The illustrated telecommunication system (GSM) should be considered as a non-limiting example, and other wireless telecommunication standards, such as WCDMA, WiMAX, WiBro, CDMA2000, etc. may implement the described technology disclosed herein without deviating from the scope of the technology disclosed herein. Some of the described parts of the GSM system, e.g. base station controller $BSC_i$ and $BSC_2$ may be omitted in certain telecommunication standards, which is obvious for a skilled person in the art.

Figure 9:
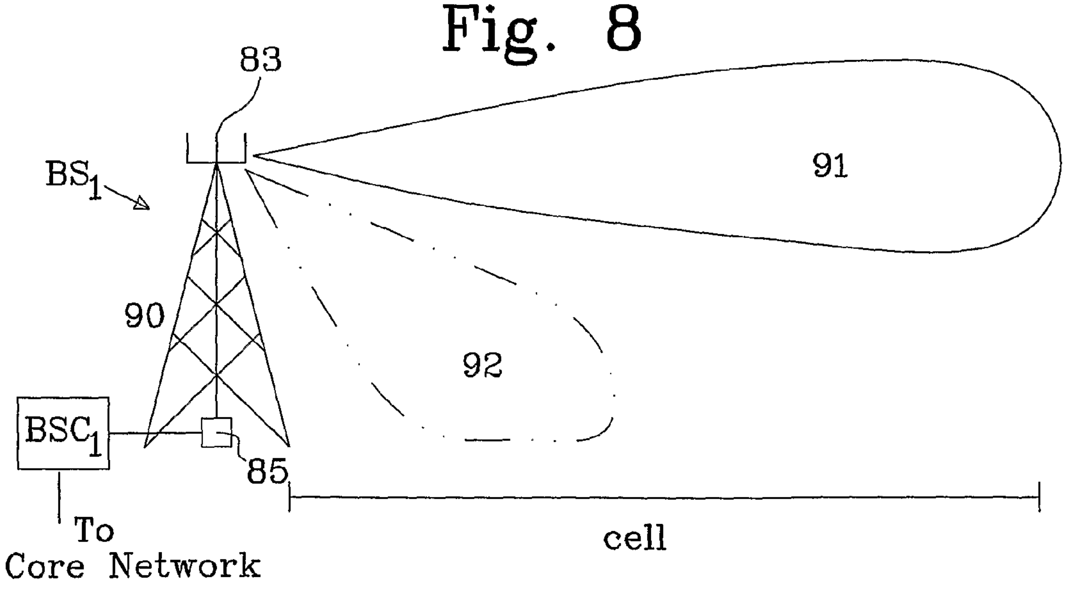
FIG. 9 schematically illustrates the tilt dependent beam shape according to the technology disclosed herein.

FIG. 9 illustrates an antenna array 83 arranged in an elevated position, such as in a mast 90. A non-linear phase shifter 85 is connected to the antenna array 83 (as described in connection with FIG. 8) and is controlled by a base station controller $BSC_1$. A non-tilted beam 91 (corresponding to the 0° plot in FIG. 7*a*) is illustrated in FIG. 9 together with a tilted beam 92 (corresponding to the 9° plot in FIG. 7*d*).

Although the technology disclosed herein has been described in detail using down-link, the skilled person in the art may readily adapt the teachings for up-link, as is mentioned above.

The invention claimed is:

1. A system for changing the radiation pattern shape of an antenna array in down-link during electrical tilting, said antenna array comprising multiple antenna elements, said system comprising:

a phase-shifting device provided with a primary port configured to receive a transmit signal, and multiple secondary ports configured to provide phase shifted output signals to each antenna element;

a phase-taper device that configured to change phase taper over the antenna elements, and thus the beam shape, with tilt angle ($\theta_{tilt}$), wherein said phase-taper device is integrated with said phase-shifting device, to form a non-linear phase-shifting device; and wherein the phase-shifting device comprises a delay line network with trombone lines, and said non-linear phase-shifting device generates non-linear progressive phase shifts over the secondary ports when changing tilt angle ($\theta_{tilt}$).

2. A system for changing the radiation pattern shape of an antenna array in up-link during electrical tilting, said antenna array comprising multiple antenna elements, said system comprising:

a phase-shifting device provided with multiple of secondary ports configured to receive phase shifted input signals from each antenna element, and a primary port configured to combine the input signals to a receive signal;

a phase-taper device that configured to change phase taper over the secondary ports, and thus the beam shape, with tilt angle ($\theta_{tilt}$), wherein said phase-taper device is integrated with said phase-shifting device, to form a non-linear phase-shifting device; and wherein the phase-shifting device comprises a delay line network with trombone lines and said non-linear phase-shifting device generates non-linear progressive phase shifts over the secondary ports when changing tilt angle ($\theta_{tilt}$).

3. The system according to claim 1 or 2, wherein the same phase-shifting device is used for down-link and up-link.

4. The system according to claim 3, wherein said phase-shifting device comprises a movable member which provides said non-linear progressive phase shifts.

5. The system according to claim 4, wherein said movable member has a rotational movement.

6. The system according to claim 4, wherein said movable member has a translational movement.

7. The system according to claim 3 or 4, wherein the system is configured to communicate phase shifted signals to/from antenna elements arranged in a uniform antenna array.

8. The system according to claim 1 or 2, wherein the system is configured to communicate phase shifted signals to/from antenna elements arranged in a non-uniform antenna array.

9. A method for changing the radiation pattern shape of an antenna array in down-link during electrical tilting, said antenna array having multiple antenna elements, said method comprising:

providing phase shifted output signals to each antenna element from multiple secondary ports of a phase shifting device, said phase-shifting device is provided with a primary port configured to receive a transmit signal;

providing changed phase taper over the antenna elements with tilt angle ($\theta_{tilt}$) using a phase-taper device, wherein said method further comprises integrating said phase-taper device with said phase-shifting device, to form a non-linear phase-shifting device;

wherein said method further comprises generating non-linear progressive phase shifts over the secondary ports of the non-linear phase-shifting device with tilt angle ($\theta_{tilt}$); and wherein the act of generating non-linear progressive phase shifts is implement as a delay line network with trombone lines.

10. A method for changing the radiation pattern shape of an antenna array in up-link during electrical tilting, said antenna array having multiple antenna elements, said method comprising:

providing phase shifted input signals from each antenna element to multiple secondary ports of a phase shifting device, said phase-shifting device is provided with a primary port configured to combine the input signals to a receive signal;

providing changed phase taper over the secondary ports with tilt angle ($\theta_{tilt}$) using a phase-taper device, wherein said method further comprises integrating said phase-taper device with said phase-shifting device, to form a non-linear phase-shifting device;

wherein said method further comprises generating non-linear progressive phase shifts over the secondary ports of the non-linear phase-shifting device with tilt angle ($\theta_{tilt}$);and wherein the act of generating non-linear progressive phase shifts is implement as a delay line network with trombone lines.

11. The method according to claim 9 or 10, comprising the step of using the same phase-shifting device for down-link and up-link.

12. The method according to claim 11, wherein the act of generating non-linear progressive phase shift is performed by moving a movable member.

13. The method according to claim 12, wherein moving said movable member includes a rotational movement.

14. The method according to claim 12, wherein moving said movable member includes a translational movement.

15. The method according to claim 11 or 12, wherein the method comprises the additional step of configuring the system to communicate phase shifted signals to/from antenna elements arranged in a uniform antenna array.

16. The method according to claim 9 or 10, wherein the method comprises the additional step of configuring the system to communicate phase shifted signals to/from antenna elements arranged in a non-uniform antenna array.

17. A base station adapted to be used in a communication network in down-link, said base station comprising:

an antenna array comprising multiple antenna elements;

a phase shifting device provided with:

a primary port configured to receive a transmit signal, and multiple secondary ports configured to provide phase shifted output signals to each antenna element;

said phase shifting device being configured to be controlled by a controller to perform electrical tilt of a beam;

a phase-taper device that changes phase taper over the antenna elements, and thus the beam shape, with tilt angle ($\theta_{tilt}$), wherein said phase-taper device is integrated with said phase-shifting device, to form a non-linear phase-shifting device; and wherein the phase-shifting device comprises a delay line network with trombone lines and said non-linear phase-shifting device generates non-linear progressive phase shifts over the secondary ports when changing tilt angle ($\theta_{tilt}$).

18. A base station adapted to be used in a communication network in up-link, said base station comprising:

an antenna array comprising multiple antenna elements;

a phase shifting device provided with:

multiple secondary ports configured to receive phase shifted input signals from each antenna element; and a primary port configured to combine the received input signals to a receive signal;

said phase shifting device being configured to be controlled by a controller to perform electrical tilt of a beam;

a phase-taper device that changes phase taper over the secondary ports, and thus the beam shape, with tilt angle ($\theta_{tilt}$), wherein said phase-taper device is integrated with said phase-shifting device, to form a non-linear phase-shifting device; and wherein the phase-shifting device comprises a delay line network with trombone lines and said non-linear phase-shifting device generates non-linear progressive phase shifts over the secondary ports when changing tilt angle ($\theta_{tilt}$).

19. The base station according to claim 17 or 18, wherein the same phase-shifting device is used for down-link and up-link.

20. The base station according to claim 17 or 18, wherein the base station comprises a uniform antenna array.

21. The base station according to claim 19 or 20, wherein said base station comprises a non-uniform antenna array.

22. A communication network comprising at least one base station according to claim 17 or 18.

* * * * *

UNITED STATES PATENT AND TRADEMARK OFFICE

CERTIFICATE OF CORRECTION

PATENT NO. : 8,384,597 B2
APPLICATION NO. : 12/444482
DATED : February 26, 2013
INVENTOR(S) : Manholm et al.

It is certified that error appears in the above-identified patent and that said Letters Patent is hereby corrected as shown below:

On the Title Page, in Item (75), under “Inventors”, in Column 1, Line 3, delete “Mōlndal (SE);” and insert -- Mölndal (SE); --, therefor.

On the Title Page, in Item (75), under “Inventors”, in Column 1, Line 4, delete “Sāvedalen (SE)” and insert -- Sävedalen (SE) --, therefor.

In the Specifications:

In Column 5, Line 39, delete “$BSC_i$” and insert -- $BSC_1$ --, therefor.

Signed and Sealed this
Fourth Day of June, 2013

Teresa Stanek Rea
*Acting Director of the United States Patent and Trademark Office*